US008733176B2

(12) United States Patent
Li

(10) Patent No.: US 8,733,176 B2
(45) Date of Patent: May 27, 2014

(54) MEMS STRESS CONCENTRATING STRUCTURE FOR MEMS SENSORS

(75) Inventor: Ping Wai Li, Hong Kong (HK)

(73) Assignee: Kontel Data System Limited, Hong Kong (HK)

( * ) Notice: Subject to any disclaimer, the term of this patent is extended or adjusted under 35 U.S.C. 154(b) by 580 days.

(21) Appl. No.: 12/873,684

(22) Filed: Sep. 1, 2010

(65) Prior Publication Data

US 2011/0048138 A1 Mar. 3, 2011

Related U.S. Application Data

(60) Provisional application No. 61/239,068, filed on Sep. 2, 2009.

(51) Int. Cl.
*G01L 9/06* (2006.01)

(52) U.S. Cl.
USPC .............................. 73/721; 73/715

(58) Field of Classification Search
None
See application file for complete search history.

(56) References Cited

U.S. PATENT DOCUMENTS

| 5,485,749 | A | * | 1/1996 | Nohara et al. | 73/514.33 |
| 5,537,882 | A | * | 7/1996 | Ugai et al. | 73/727 |
| 5,698,785 | A | * | 12/1997 | Rich et al. | 73/514.33 |
| 6,128,961 | A | * | 10/2000 | Haronian | 73/774 |
| 6,722,206 | B2 | * | 4/2004 | Takada | 73/779 |
| 6,938,487 | B2 | * | 9/2005 | Chen et al. | 73/514.36 |
| 7,082,251 | B2 | * | 7/2006 | Kurumada et al. | 385/140 |
| 7,123,111 | B2 | * | 10/2006 | Brunson et al. | 331/116 M |
| 7,367,232 | B2 | * | 5/2008 | Vaganov et al. | 73/514.33 |
| 7,484,422 | B2 | * | 2/2009 | Sumigawa et al. | 73/777 |
| 7,827,865 | B2 | * | 11/2010 | Hattori et al. | 73/514.33 |
| 8,004,052 | B2 | * | 8/2011 | Vaganov | 257/415 |

OTHER PUBLICATIONS

A. Gupta, R. Bashir, G. W. Neudeck, and M. McElfresh, Design of Piezoresistive Silicon Cantilevers with Stress Concentration Region (SCR) for Scanning Probe Microscopy (SPM) Applications, School of Electrical and Computer Engineering, Purdue University, West Lafayette, IN 47907, Department of Physics, Purdue University, West Lafayette, IN 47907.

* cited by examiner

*Primary Examiner* — Lisa Caputo
*Assistant Examiner* — Jermaine Jenkins
(74) *Attorney, Agent, or Firm* — Muncy, Geissler, Olds & Lowe, P.C.

(57) ABSTRACT

A stress concentrating apparatus and a method for a Micro-ElectroMechanical System (MEMS) sensors is provided. The apparatus includes a plate having an inner region and outer region, the inner region being separated from the outer region by slits defined in the plate. A stress concentrator bridge connects the inner region to the outer region, and to mechanically amplify stress applied on the inner region of the plate. At least one stress sensor is operatively connected to the stress concentrator bridge, whereby the at least one stress sensor converts the mechanically amplified stress applied on the inner region into an electrical signal.

2 Claims, 18 Drawing Sheets

MEMS STRESS CONCENTRATING STRUCTURE FOR MEMS SENSORS

This nonprovisional application claims priority to U.S. Provisional Application No. 61/239,068, which was filed on Sep. 2, 2009, and which is herein incorporated by reference.

BACKGROUND OF THE INVENTION

1. Field of the Invention

The invention relates to a design for and methods for the manufacturing of a stress concentrating structure for applications in MicroElectroMechanical System (MEMS) sensors in particular with respect to microphone and pressure sensor involving the entire or partial composition of all electronic and mechanical elements of the device functions on a silicon substrate or any other material.

2. Description of the Background Art

Smaller size, better performance and lower cost per function are the major driving forces behind the modern electronic industries. To achieve such goals, the industry is attempting to integrate more functions, including mechanical sensors and their sensing electronics, into miniaturized chips.

The most common method for transduction in MEMS microphones and pressure sensors are based upon the capacitance sensing method. This method relies on the measured quantity inducing a proportional displacement in one electrode of a capacitance structure. The capacitance change can then be converted into an equivalent electrical signal.

The disadvantages and difficulties of the conventional art for the realization of stand alone sensor or single chip sensor for microphones, pressure sensors or inertial sensors (but not limited to the above) based on capacitance sensing structures are explained and illustrated by the capacitive MEMS microphone in FIGS. 1 and 2.

FIGS. 1 and 2 illustrate a conventional art construction of a capacitive MEMS microphone 10. It includes a thin bottom plate electrode 12 or membrane formed on a pedestal 13, usually made of silicon. A top plate electrode 11, usually larger in lateral dimension, thicker and perforated, is supported on top of the bottom plate 12 by means of pillars 14. A hollow cylindrical hole 15 of the same dimension as the bottom plate 12 is etched through in the pedestal 13. When a sound wave 16 impinges on the bottom plate 12 either through the hole 15 or from the top through the perforated top electrode 11, the pressure (P~1 mPa to 10 Pa) causes the bottom plate 12 to deform and changes the distance between the top and bottom electrodes 11, 12. This causes the capacitance between the electrodes 11, 12 to change. A circuit picks up this capacitive change and transduces into an electrical signal.

FIG. 2 illustrates a cross sectional view of the microphone of FIG. 1. The bottom electrode 12 is flexible and changes its distance to the top electrode 11 when a sound wave 16 impinges. The capacitance is a inverse function of inter-electrode distance d. The initial value of d, which determines the static capacitance of the capacitor $$\left(C = \frac{\varepsilon_0 A}{d}\right),$$

can change substantially when there are internal stresses in the top and bottom plates. The change of d with pressure, which shows up as sensitivity of the microphone, is a complex function that depends on the dimension and shape of the bottom electrode 12, its thickness, and the material constant of the electrode 12. These parameters are often not very well controlled functions of a manufacturing technology.

Silicon MEMS microphones are increasingly replacing the Electret Condenser Microphones (ECM) in electronic products because of its smaller size and ruggedness in SMT assembly. Almost all commercial realization of the MEMS microphone uses a two chip approach. It includes a silicon MEMS based capacitive membrane chip connected to a pre-amplifier chip. The two chips are assembled onto a suitable substrate such as a FR-4 PCB and further protected by a packaging cover.

The typical electrical parameters of a silicon MEMS microphone are:

| | |
|---|---|
| Sensitivity | −42 dBV/Pascal |
| Signal/Noise Ratio | 60 dB |
| HV Generator | 10-12 V +/− 0.25 V |
| Amplifier Output Noise (@ O dB gain) | <10 µV |
| Current Consumption | 150 µA |
| Supply Voltage Range | 1.5 V-4.5 V |

The MEMS microphone membrane works on the principle of a pressure sensitive capacitor, in which one plate (the flexible plate) is made to bend under the pressure of a sound wave 16. This alters the capacitance of the capacitor, which can be sensed when a voltage is imposed across. This function is illustrated in FIG. 1.

The typical physical parameters of a capacitive MEMS microphone membrane are:

| | |
|---|---|
| Inter-electrode distance d | 1.5-2 µm |
| Fixed electrode thickness | 5-20 µm |
| Flexible electrode thickness | 0.4-0.7 µm |
| X-Y dimension | <800 µm |
| Die dimension | <1.2 mm × 1.2 mm |

For the single chip integration, almost all the attempts have been based upon using the capacitive MEMS membrane as the sensor, despite the many difficulties and drawbacks of implementing the capacitive MEMS membrane with the integrated circuit chip due to reasons described below. For these reasons the cost of the single chip MEMS microphone remains high and is unable to compete with the two chip MEMS microphone or the ECM microphone.

In the MEMS microphone capacitive membrane, the capacitor has two plates separated from each other usually by air plus an insulator on the plates and supported on insulating material. In order to obtain a pre-determined capacitance and hence the important sensor parameter of sound pressure to voltage sensitivity of the microphone, the distance between the two plates must be made to an exact specification. This has two implications: the fixed and flexible electrodes must experience low stress so that they would not bend and alter the inter-electrode distance between them; and the inter-electrode gap of air, determined primarily by the insulating stud between the two plates, and the thickness of dielectric layers of silicon oxide/nitride must be made constant and repeatable. The two imperfections must be controlled and contribute to the complexity of the design and affects the manufacturing yield of a capacitive MEMS microphone.

Internal stress develops in all polycrystalline films formed by chemical or physical deposition methods. The notable materials are usually polysilicon, silicon dioxide and silicon nitride. The stress can be tensile or compressive. Its formation and magnitude depends on the thickness, method of deposition and deposition parameters. The magnitude of the stress is very difficult to control and the variation can be large, up to + and −100%. Silicon nitride has a larger stress compared to polysilicon and silicon oxide. Silicon rich nitride has a lower stress but because its oxidation leads to silicon oxynitride which is difficult to etch, its use within the IC production process is not mainstream and often avoided. Since oxide and nitride are not conductors, polysilicon is often used as material for the conducting plates in conjunction with nitride or oxide because polysilicon must be protected from the environment due to its richness in grain boundaries, which can lead to point of weakness when the material is exposed to etchants. The stress from such composites is even harder to control. Thus in the early development of the capacitive MEMS microphone sensors, much attention has been given to constructions and designs which lead to stress relief or stress tolerant structures.

The thickness of thermally grown films can be controlled with great accuracy. Such growth, however, takes place at an elevated temperature (usually >900° C.) and as to be seen later, may not be a desirable part of the capacitive sensor formation process unless the sensor plates are formed as part of the IC process itself. If true, this will compromise and introduce variations to the basic IC process which adds significant cost and complexity to the already complicated IC process. Thus inter-electrode control tends to be done by a low temperature plasma enhanced chemical vapor deposition process at lower temperature, sputtering, physical evaporation or even spin on of polymers or inorganic substances such as a spin on oxide. The thickness control using these methods ranges from fair to poor.

In the manufacturing of MEMS capacitive sensing structures, the surface tension of water or a cleaning fluid plays a special role. Stiction, referring to the sticking together of two opposite hydrophilic surfaces through surface tension force from water, occurs during the drying process subsequent to wet etching and cleaning. The surface tension in a small droplet of water would pull the two surfaces together during drying and the surface atomic force can keep the surface attached, therefore destroying the function of the sensor. Since aqueous processing is an essential part of the MEMS manufacturing as well as a cutting process to eliminate silicon particle contamination, stiction places serious constraints on the realization of capacitive sensing structures and post-process fabrication steps. Stiction is avoided by using HF vapor etching of sacrificial oxide spacer or super-critical drying in aqueous cleaning. But use of the latter is not possible during wafer cutting, adding a further complication to the manufacturing process.

In consideration of a MEMS silicon capacitive sensing structure for single chip integration, a particular sequence of high temperature and low temperature material processing, the compatibility of the different materials with each other with respect to chemical and physical processing, and the number of process steps introduced on top of the basic integrated circuit process to add the mechanical element. In general, the mechanical element is added as the last steps, as a so called post-CMOS process, to the IC process. To avoid melting the metallic aluminum interconnect, the processing temperature must be kept below 450° C. This places constraints on the choice of materials that can be used for the mechanical structures, conducting or non-conducting, their properties and the methods of deposition.

In a single chip MEMS microphone the rest of an integrated circuit (IC) is sealed under PECVD nitride and oxide. An opening is made to the membrane area. For realizing capacitive membrane, there are about five material layers with etching and five lithography steps involved in the formation of this two plate capacitor membrane. Even if some of these layers and steps can be shared with the basic IC process, the process is still a relatively complicated endeavor. Controlling the thickness of the lower electrode is critical. It determines the bending of the circular/rectangular plate which determines the sensitivity. Also, controlling the spacing of the inter-electrode spacing is critical. The material must be compatible with the release process. Oxide and polysilicon grain boundary is attacked or weakened by HF vapor, a dry release chemical. Thus an inter-electrode sacrificial spacer material must be selected carefully to accommodate deposition temperature, thickness control and etching compatibility with surrounding materials. Not many combinations of materials are available as solutions. They are often very complex.

The circuitry of a capacitive MEMS microphone includes a low noise accurate charge pump, a low noise amplifier with insulated gate input and an accurately controlled impedance for biasing the amplifier and controlling the noise of the MEMS sensor-amplifier combination. The circuit is small by VLSI standards but its size is not linearly scalable with respect to technology line-width shrinkage. In general, the noise of the capacitive MEMS microphone is limited by kT/C noise where C is the capacitance of the MEMS sensor and parasitic capacitances. For C=1 pF, the noise voltage (from 100 Hz to 10 kHz) is above 10 microvolts. It increases with decreasing C, 1.4 times for halving the capacitor value. There is thus a fundamental size of the MEMS capacitor membrane beyond which the sensor cannot be shrunken for deterioration of the signal to noise ratio of the sensor. A common fallacy in designing capacitive microphone is the assumption that with decreasing C, the sensitivity can be restored by making the flexible plate thinner. But such an act would decrease the maximum voltage at which the sensor can operate due to the decreasing pull-in voltage of the electrostatic attraction, thus negating any improvement that comes from making the capacitor thinner. The SNR of the MEMS capacitive microphone is often given in dB and it is the ratio of the voltage signal output of the microphone at 1 Pascal sound pressure and the noise output of the microphone without input A-weighted. The A-weighting eliminates a large portion of the amplifier noise at low frequency. Prevalent of this SNR is around 60 dB. For capacitive MEMS microphone, A-weighting improves the SNR by about 2-4 dB. This figure also depends on the low frequency characteristics of the amplifier.

An alternative method of transduction is based upon piezoresistive sensing in a single silicon plate. The method has been applied to plates of MEMS pressure sensors where piezoresistors are embedded at the edges of a square or circular silicon plate. Applied pressure causes stress at the edge depending on the length/thickness of the plate and this stress can be transduced by the piezoresistors.

The disadvantages of the plate/piezoresistive structure are that it is extremely hard to control the uniformity and thickness of a large plate during the etching process. A non-uniformity of the plate causes errors in the reading of the piezoresistor. The sensitivity of the pressure sensor is determined by the thickness of the plate. If this thickness is limited to a maximum, then the sensitivity of detection drops. For this reason, the structure is not applied in any commercial realization of a MEMS microphone or ultra-sensitive pressure sensor. It further limits the size of a pressure sensor in that a minimal force has to be created through the area of the plate to create a detectable stress. For these reasons, the plate/piezoresistive structure is less used in favor of the capacitance sensing structure.

SUMMARY OF THE INVENTION

The present invention is a MEMS stress concentrating structure and its application to the design of MEMS microphone and pressure sensor. The structure uses bridge plates also referred to as stress concentrator bridges which focus the mechanical pressure or force into narrow regions of a structure composing of an inner region and an outer region separated by narrow slits and being joined together by stress concentrator bridges. The inner region may be located at the centre of the plate. The pressure or force acting on the inner region is then concentrated and its effect amplified in a controlled manner as stress in the stress concentrator bridges. The stress concentrator may have a stress sensing device built in based on the piezo-electric effect for sensing the amplified stress. In case it does not, it serves simply as a supporting and connecting member between the inner and outer region.

With the stress concentrator structure, it is possible to construct different mechanical sensors with relatively simple process steps in a MEMS technology for microphone and pressure sensor.

In a first aspect, there is provided a plate of monolithic material or composite material having different layers of a predetermined shape. The plate is delineated into an outer region and an inner region by slits, of predetermined shapes, cut into the plate. The outer region is supported on a pedestal and it can be joined as part of the whole to a pedestal or separated from it by a thin film of material. The outer region and the inner region are joined by multiple stress concentrator bridges which are formed when the cuts are made. Each stress concentrator bridge acts to concentrate or amplify the stress in the stress concentrator bridges caused by point or distributed forces acting on the inner region or part of the inner region. The stress concentrator bridges may have but do not need to have the same composition of material layers as the inner region.

In a second aspect, there is provided one or more piezoelements of a resistor, a diode/transistor of the bipolar type or of unipolar type located within (or across) the boundary of any or each of the stress concentrator bridges. By application of a suitable electrical stimulus such as current or voltage the piezo-element converts the concentrated or amplified stress into a voltage or a current.

In a third aspect, there is provided a design of a MEMS microphone on a single monolithic silicon substrate. The microphone is formed by using an inner region in the shape of a square/rectangular, polygon or circular/oval shape and stress concentrator bridges with piezo-electric sensing element placed at or close to point of maximum stress on one or more of the stress concentrator bridges. The slits and part of the inner/outer regions may be covered with a third material of suitable thickness whose Young's modulus is much less than the stress concentrator bridges.

In the fourth aspect, there is provided a design of a MEMS pressure sensor on a silicon substrate. The pressure sensor is formed by using an inner region having a shape of a square/rectangular, polygonal or circular/oval shape and stress concentrator bridges with piezo-electric sensing element placed at or close to the point of maximum stress on one or more of the stress concentrator bridges. The slits and part of the inner/outer regions must be covered with a third material of suitable thickness whose Young's modulus is much less than the stress concentrator bridges.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
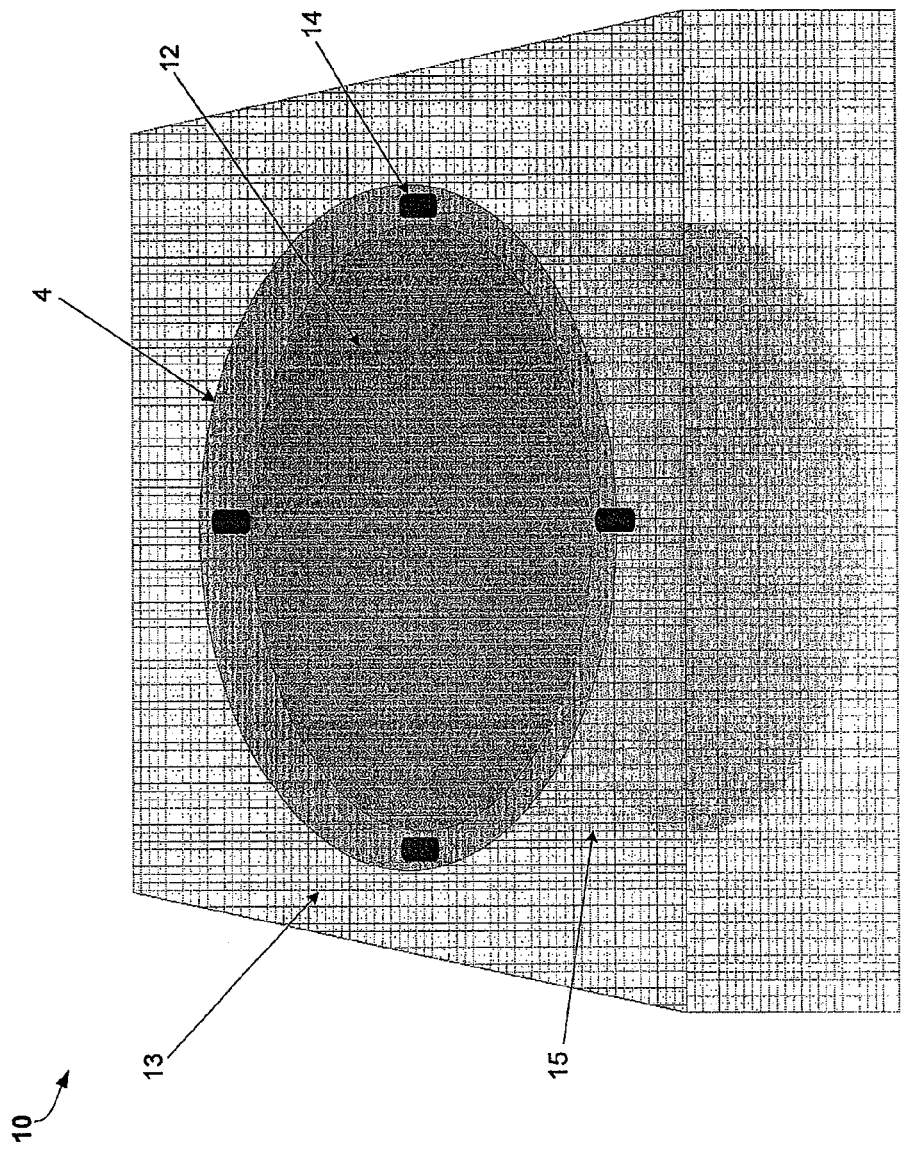
FIG. 1 is a side plan view of a conventional capacitive MEMS microphone.
Figure 2:
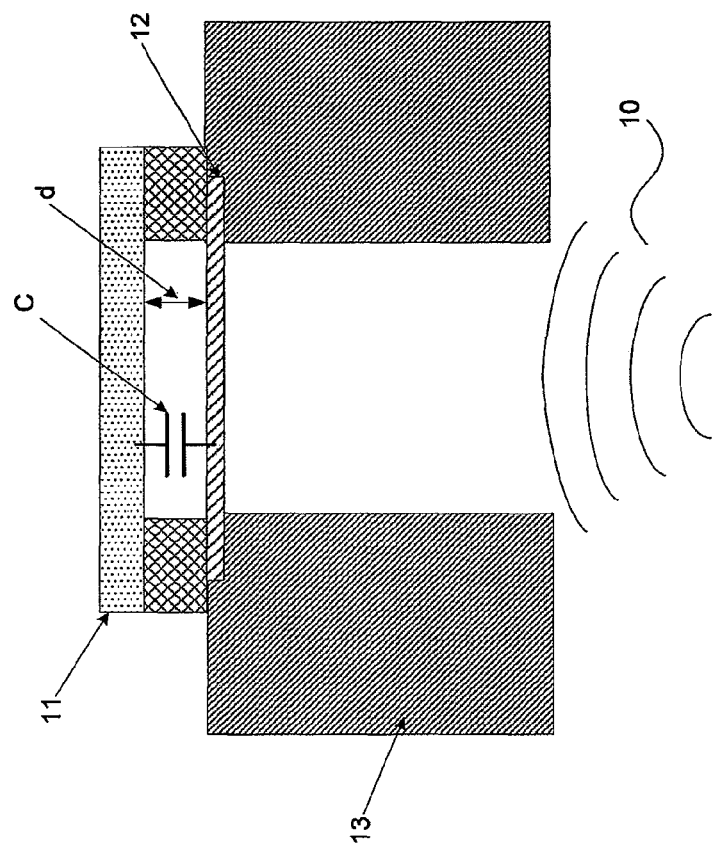
FIG. 2 is a sectional side view of the conventional microphone of FIG. 1.
Figure 3:
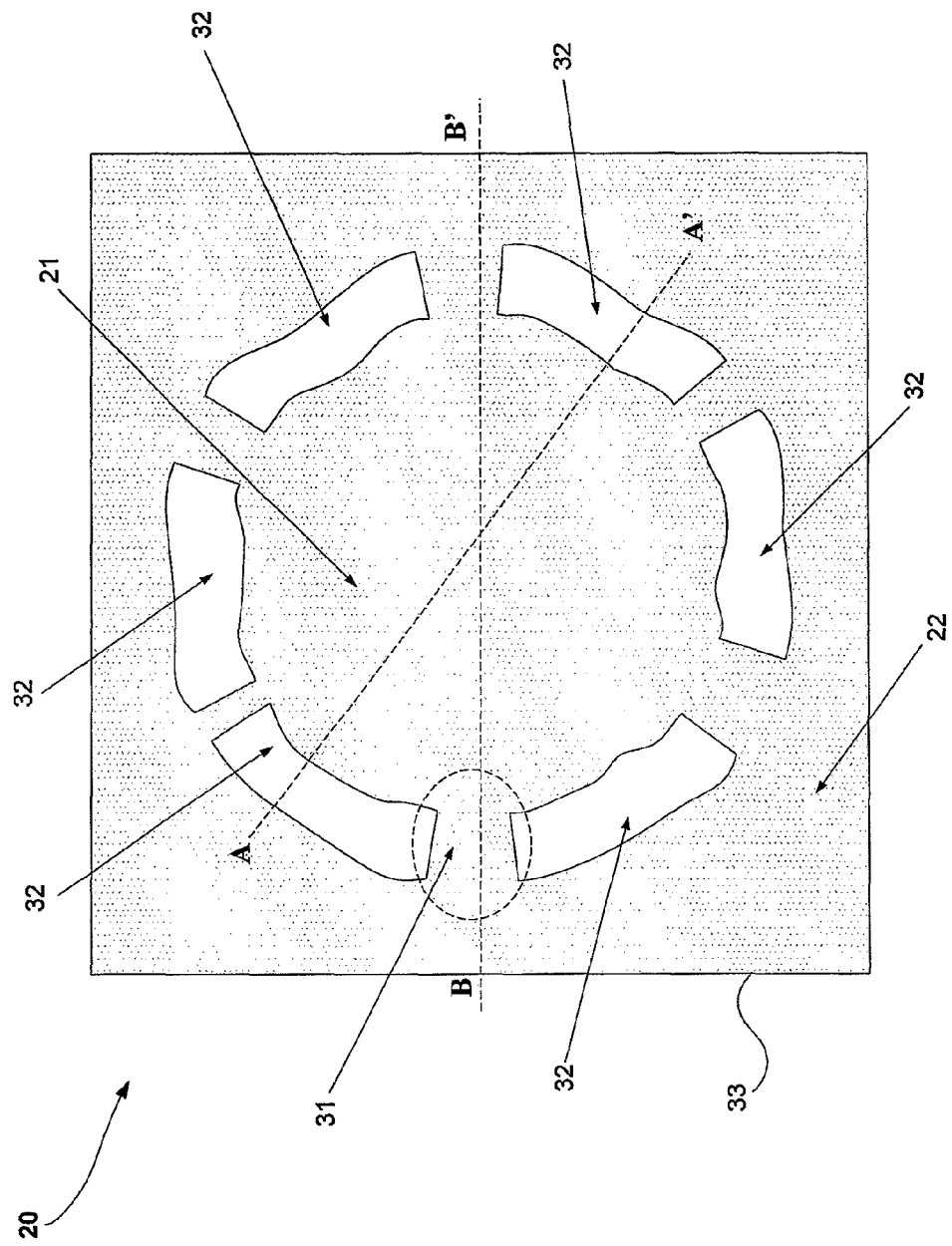
FIG. 3 is a top plan view of a stress concentrator structure in accordance with an embodiment of the present invention.
Figure 4:
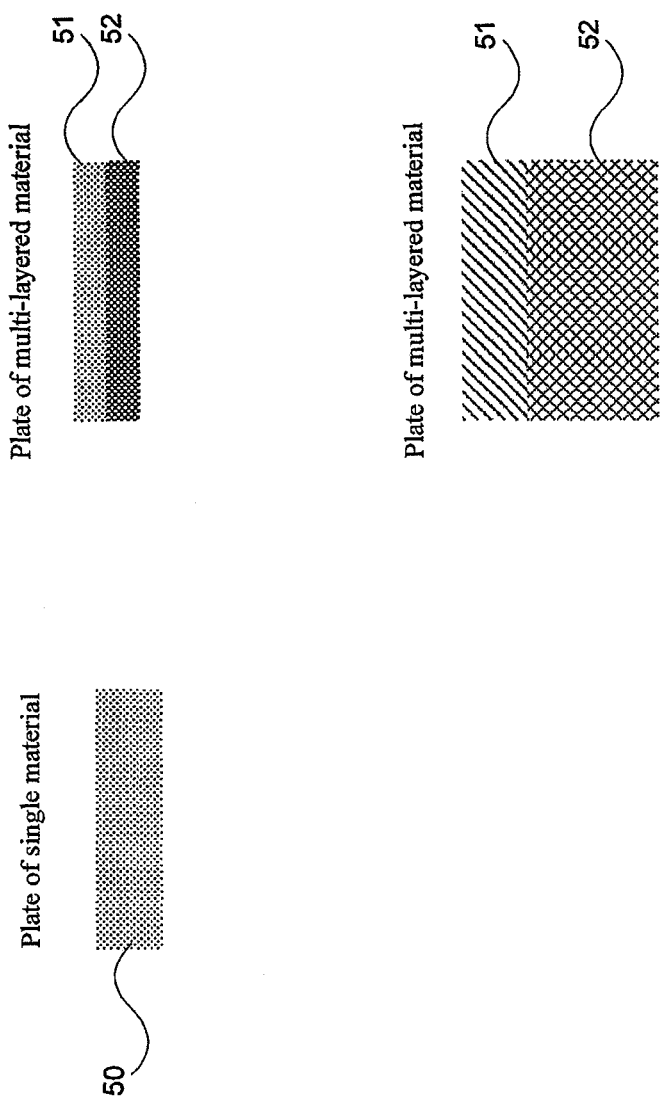
FIG. 4 is a sectional side view of the materials for a plate of the stress concentrator structure of FIG. 3.

FIG. 3 shows the construction of a MEMS stress concentrator structure 20. The structure 20 includes a plate 33, usually having a rectangular outer boundary. The plate 33 can be formed by a single monolithic material or multi-layers of different materials as depicted in FIG. 4. The plate 33 has an outer region 22 and inner region 21 which is defined by slits 32 formed in the plate 33 by photolithographic patterning and etching. The slits 32 can be of any predetermined shape to suit the MEMS sensor design and accommodate internal stresses in the inner region 21 as well as stresses from external forces. The usual lateral dimension are on the order of tens to hundreds of microns. The width of the inner region 21 can range from a fraction of a millimeter to several millimeters. The inner region 21 is part of the plate 33. But the inner region 21 does not have to have the same thickness or vertical composition as the outer region 22. The inner region 21 can be altered in its vertical composition through etching or deposition. The inner and outer regions 21, 22 are connected together by narrow bridge-like members called stress concentrator bridges 31. The stress concentrator bridges 31 are part of the original plate 33. But like the inner region 21, the stress concentrator bridges 31 can be altered in vertical composition as well as dimensions by subsequent process steps in MEMS process technology. The stress concentrator bridges 31 are usually rectangular in the plane of the plate 33 and in cross section. But this shape can be modified by necessity in design or imperfection in the MEMS process technology to different shapes. The length, width and thickness of the stress concentrator bridges 31 as well as the elastic constants of the different material layers determine the stress concentration or amplification in the stress concentrator bridges 31. Different stress concentrator bridges 31 may have different lengths and widths. The number of stress concentrator bridges 31 is usually an even number. A stress concentrator bridge 31 may have a corresponding stress sensor 40 but not always. The outer region 22 is supported on a pedestal 35, formed usually of silicon but can be of any other material compatible or compliant with the MEMS process technology. The inner region 21 and part or all of the stress concentrator bridge 31 and/or a part of the outer region 22 of the plate 33 are exposed from the bottom through a hole 36 in the pedestal 35. The dimension and shape of the hole 36 are designed to suit the need of the MEMS sensor in application.

FIG. 4 shows that the plate 33 of the MEMS stress concentrator structure 20 can be made from a single layer material 50 or multi-layered materials 51, 52. The material is selected based on mechanical support, internal stress condition, electrical properties, corrosion resistance and process compatibility. The monolithic material can be silicon or another semiconductor material. The combination of multi-layered material 51, 52 is various and cannot be enumerated individually. For example, it can be monolithic or poly-silicon on silicon dioxide film or monolithic silicon embedded in silicon nitride/silicon dioxide.

Figure 5:
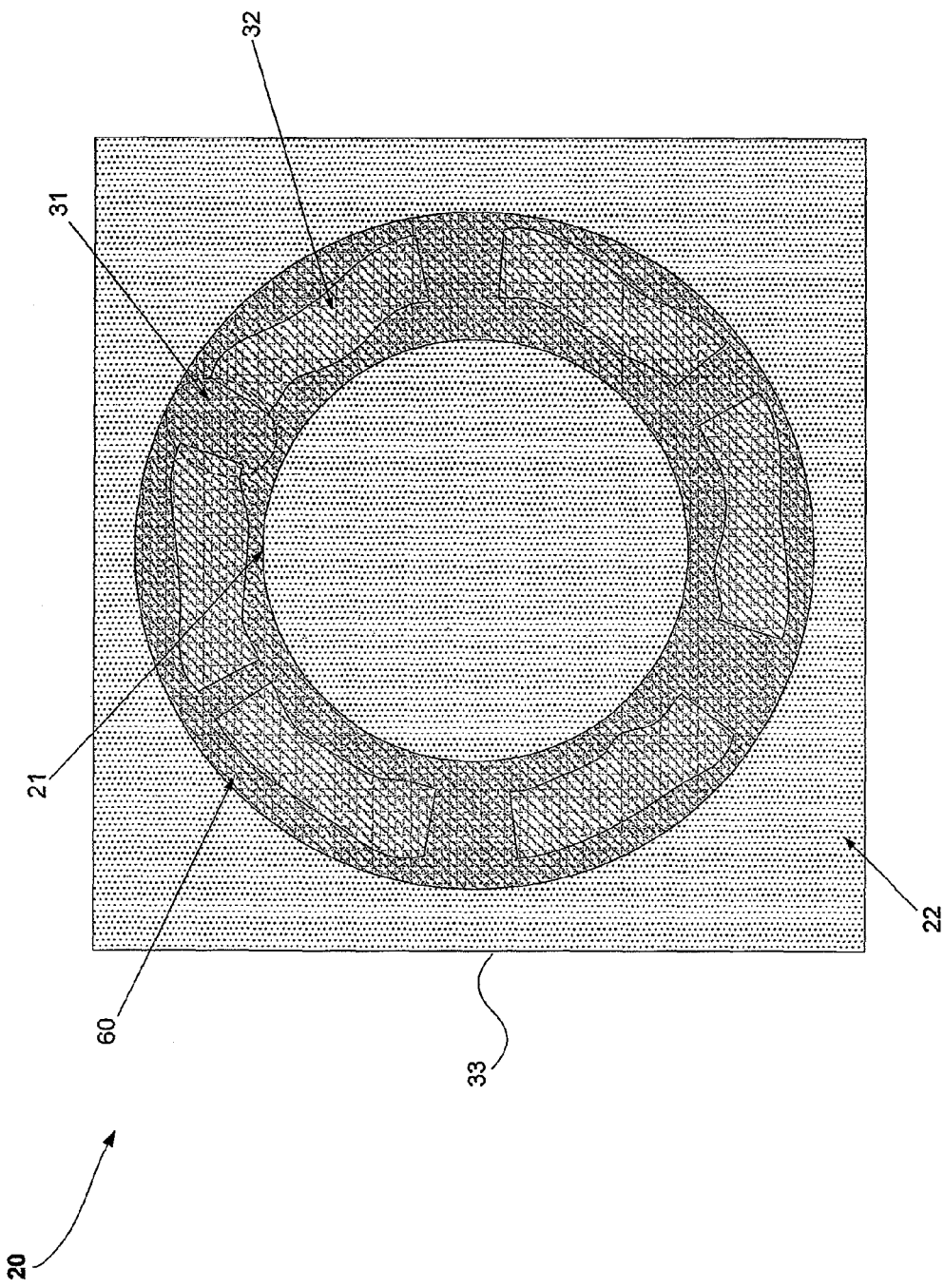
FIG. 5 is a top plan view of a stress concentrator structure with a thin layer of soft material covering slits in accordance with an embodiment of the present invention.

FIG. 5 shows a stress concentrator structure 20 with a thin layer of soft material 60 covering the slits and partially or totally covering the inner region. The soft material 60 has a Young's modulus of elasticity much lower than those materials forming the plate 33. This construction is used for static pressure sensing applications. The soft material 60 seals the slits 32 and divides the top and lower parts of the plate 33 at its inner region 21 into two spaces. These two spaces can have different pressures and the difference in force is exerted as a differential pressure on the inner region 21. The soft material 60 does not alter the stress on the stress concentrator bridge 31 substantially because of its low elastic constant.

Figure 6:
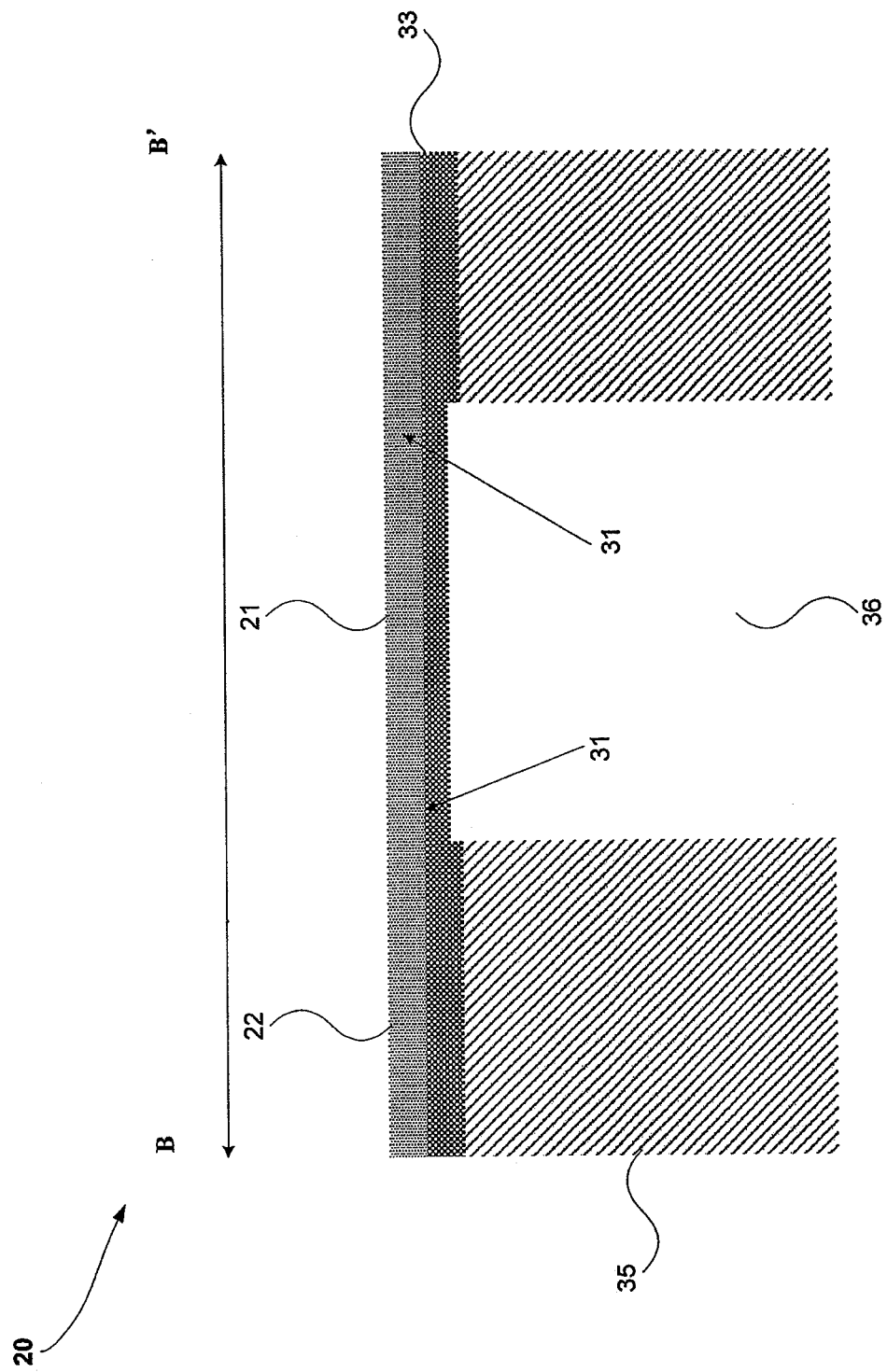
FIG. 6 is a sectional side view of the stress concentrator structure along the line B-B' in FIG. 3.

FIG. 6 illustrates the cross sectional view of the stress concentrator structure along the line B-B' in FIG. 3. The outer region 22, stress concentrator bridges 31 and inner region 21 are shown. The plate 33 is shown, by way of an example, to be formed by two materials. The inner region 21 and stress concentrator bridges 31 are drawn to be uniform and thinner than the outer region 22. This does not always have to be the case and depends on the application. The inner region 21 can be patterned and etched into sub-regions of different thickness such as a honeycomb structure to help strengthen its rigidity and decrease its weight. The stress concentrator bridges 31 can have constrictions along its length, either on top surface or bottom surface or both, to further increase its concentration or stress amplifying ability. The central hollow hole 36 in the pedestal 35 is usually formed by deep reactive ion etching in which case the side walls are usually vertical. In case the hole 36 is formed by wet etching, the side walls can be sloped or inclined.

Figure 7:
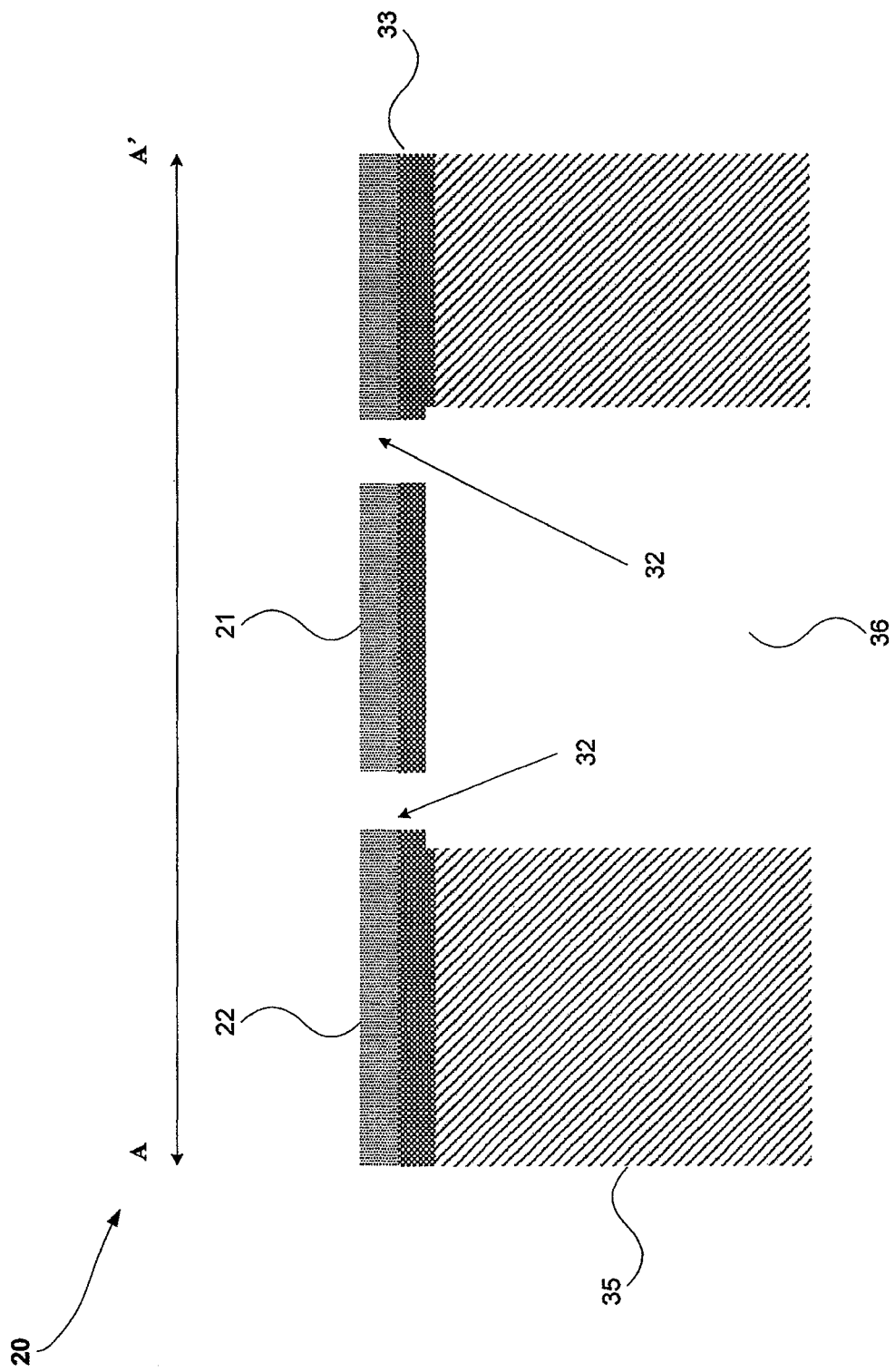
FIG. 7 is a sectional side view of the stress concentrator structure along the line A-A' in FIG. 3.

FIG. 7 illustrates the cross sectional view of the stress concentrator structure 20 along the line A-A' in FIG. 3. The slits 32 are shown. Each slit 32 is formed by etching the plate 33. The slit 32 can be any width and is primarily determined by the nature of the application. In the normal case where the stress concentrator structure 20 is not sealed as in an application for the microphone, for example, the slit 32 is dimensioned such that the outer and inner regions 21, 22 are separated to the minimum amount to allow air to be exchanged between the top region of the plate 33 and the hollow hole 32 in the pedestal 35 with determined resistance. In this case, the slit 32 can range between between a fraction of a micron to a few microns.

Figure 8:
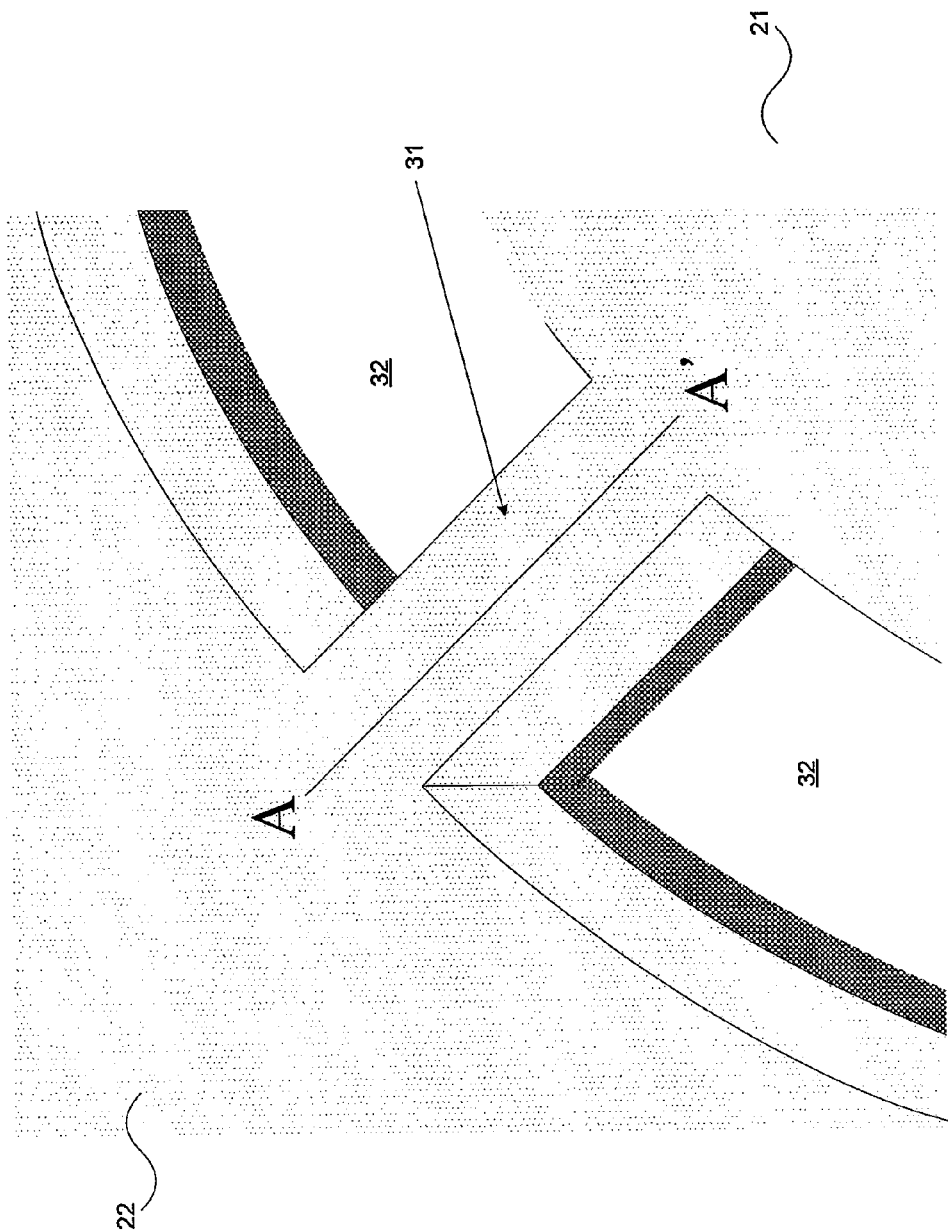
FIG. 8 is a zoomed in side view of a stress concentrator bridge of the stress concentrator structure.

FIG. 8 shows the side view of a stress concentrator bridge 31. The stress concentrator bridge 31 is formed when the slits 32 are etched. The stress concentrator bridge 31 is usually rectangular in its length and cross section except variations due to photolithographic and etching. This is to ensure uniform stress distribution for the piezo-electric stress sensor 40 located on the stress concentrator bridge 31. Where the stress concentrator bridge 31 is anchored to the outer region 22 or the inner region 21, the shape may change and it is done to smooth out the unwanted stress concentration at corners and bends. A stress concentrator bridge 31 serves the purposes of supporting the inner region 21 of the plate 33 with the pedestal 35, focusing the force or pressure exerting on the inner region 21 of the plate 33 onto itself and amplifying the magnitude of the stress in a controlled manner.

Figure 9:
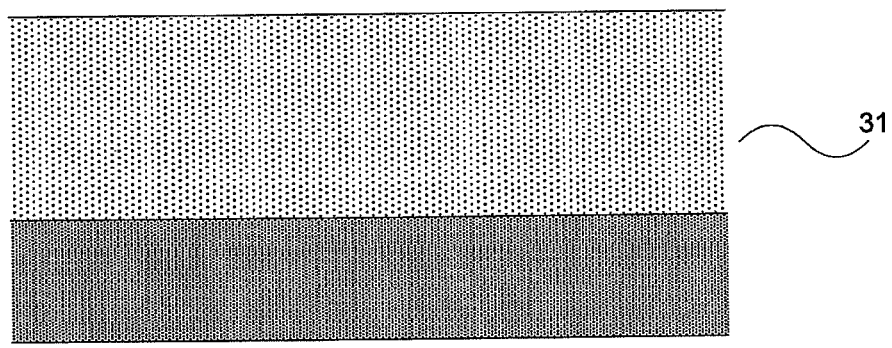
FIG. 9 is a sectional side view of a stress concentrator bridge without constriction along its length A-A' from FIG. 8.
Figure 10:
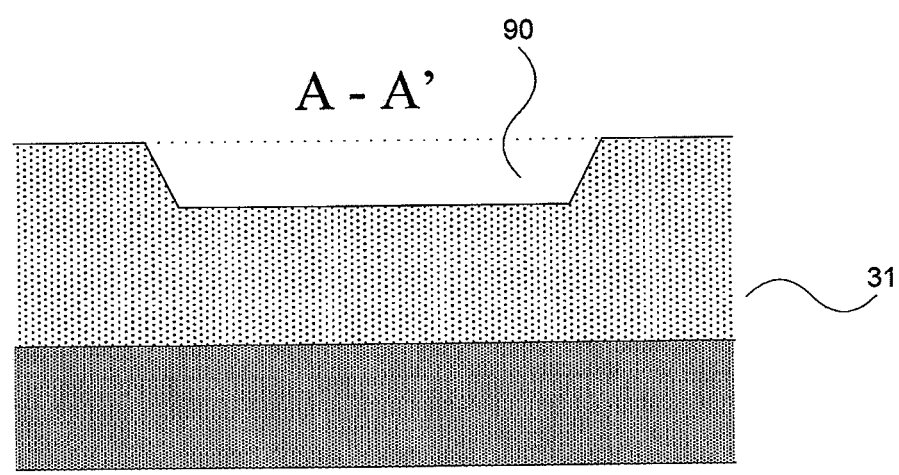
FIG. 10 is sectional side view of a stress concentrator bridge with top constriction along its length A-A' from FIG. 8.
Figure 11:
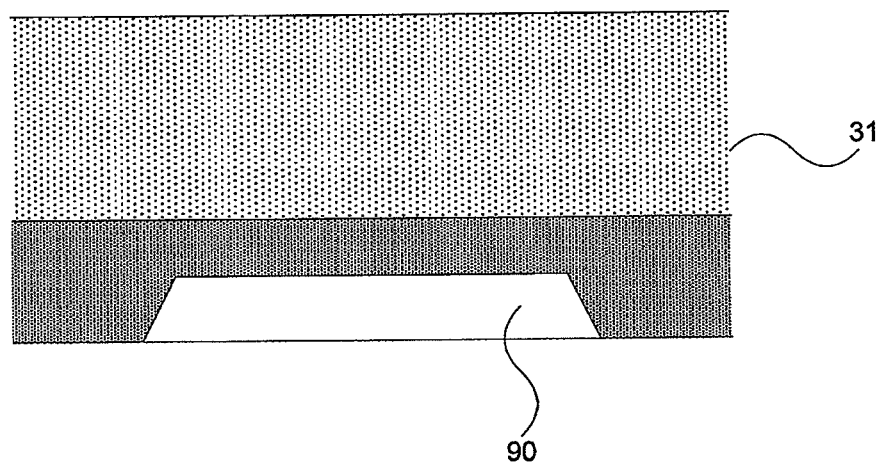
FIG. 11 is sectional side view of a stress concentrator bridge with bottom constriction along its length A-A' from FIG. 8.
Figure 12:
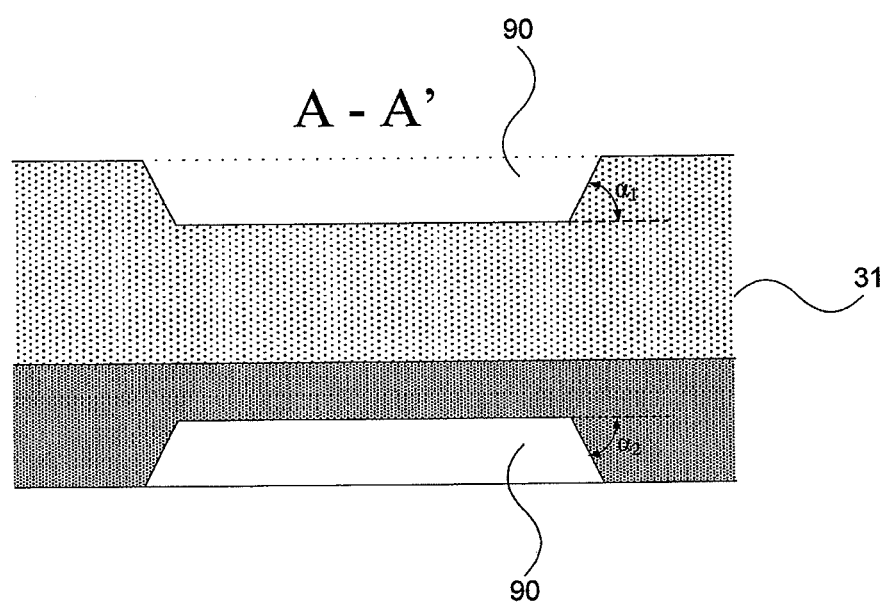
FIG. 12 is sectional side view of a stress concentrator bridge with top and bottom constrictions along its length A-A' from FIG. 8.

FIGS. 9 to 12 shows the different cross sections that a stress concentrator bridge 31 may have along its length A-A' from FIG. 8. FIG. 9 shows a rectangular section without constriction 90. FIG. 10 shows a section with a constriction 90 on the top. The constriction 90 increases the stress on both top and bottom surfaces of the stress concentrator bridge 31. FIG. 11 shows a constriction 90 on the bottom of the stress concentrator bridge 31 with the same effect. FIG. 12 shows constrictions 90 both on the top and bottom of the stress concentrator bridge 31.

Figure 13:
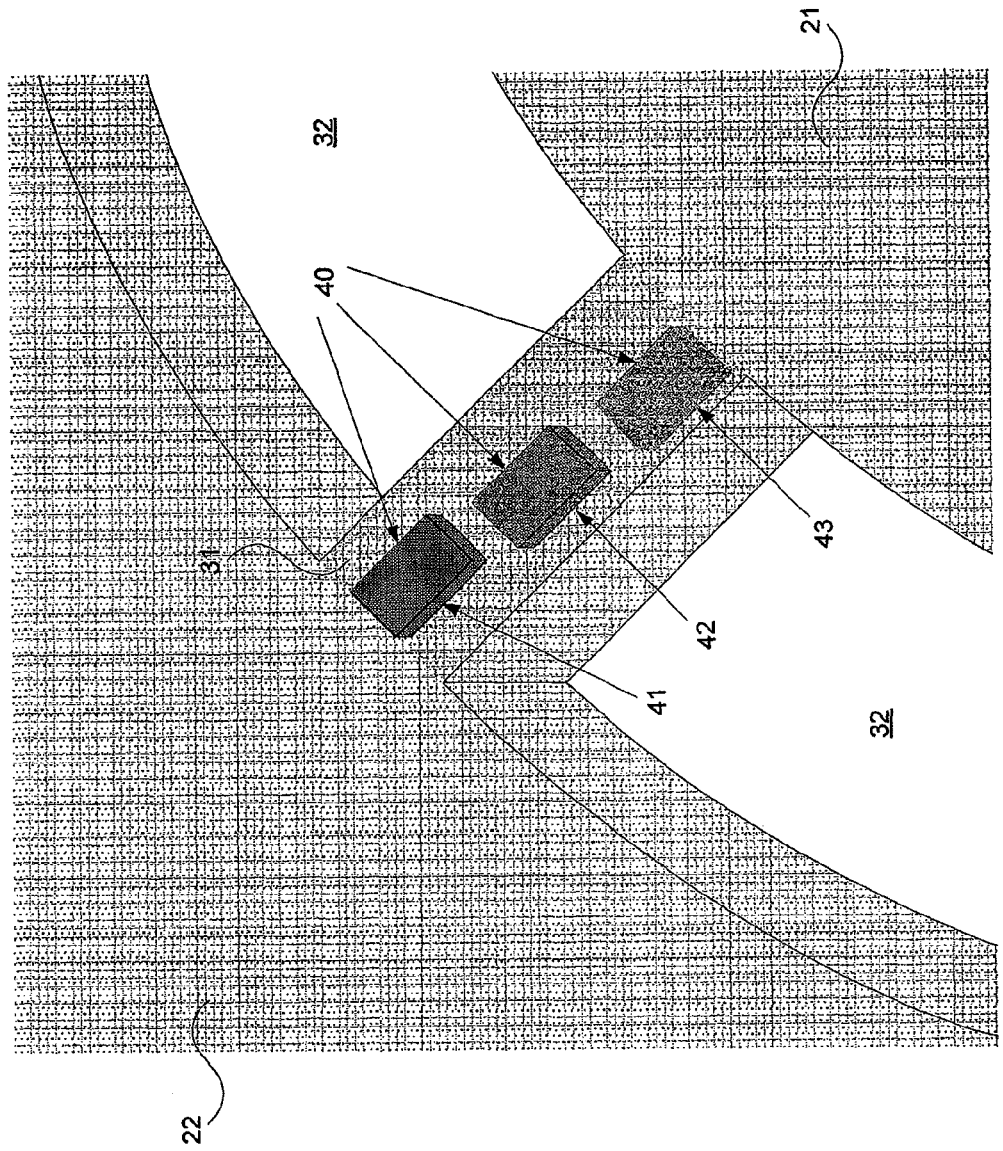
FIG. 13 is a zoomed in side plan view of a stress concentrator showing a stress sensor on the stress concentrator bridge.

FIG. 13 shows the side view of a stress concentrator bridge 31 with a piezo-electric stress sensor 40. The piezo-electric stress sensor 40 transduces the stress in the stress concentrator bridge 31 into an electrical signal. This signal can be in the form of a voltage or a current. The stress sensor 40 can be constructed on the top surface 41, embedded inside 42 or on the bottom surface 43 of the stress concentrator bridge 31. This can be accomplished through processing on the different layers of materials forming the plate 33. For example, where the stress concentrator bridge 31 is formed by a layer of monolithic silicon on silicon dioxide, a piezo-resistor or piezo-junction transistor can be formed by selective implantation of different ions into different regions on the stress concentrator bridge 31. In case the piezoelectric sensor requires surface protection, a protective layer of silicon dioxide, silicon nitride or any other suitable material can be deposited on top of the stress sensor 40, thereby embedding the stress sensor 40 within the stress concentrator bridge 31.

Figure 14:
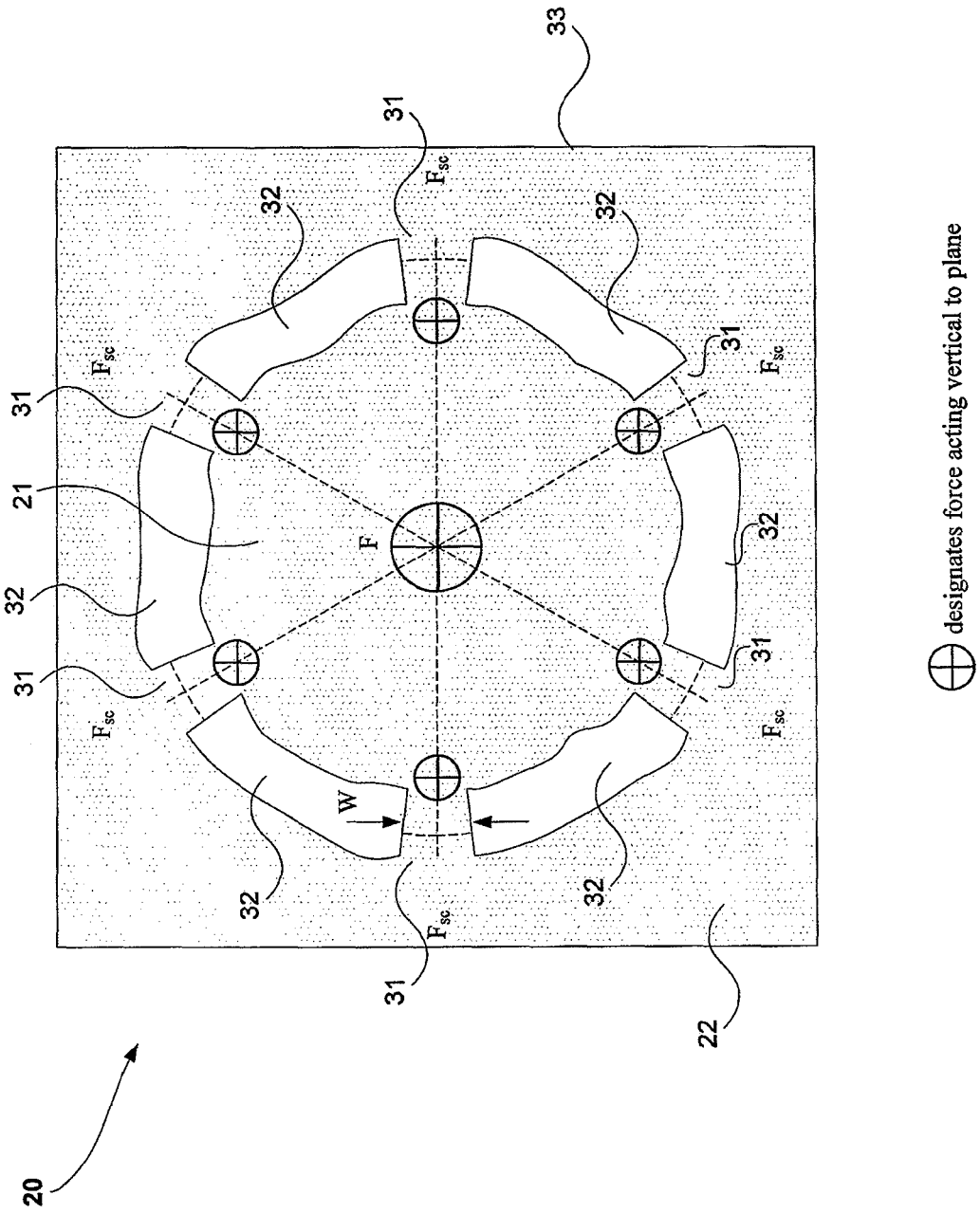
FIG. 14 is a top plan view of a stress concentrator structure with a rotational symmetry of the stress concentrator bridge and slits.

FIG. 14 shows a stress concentrator structure 20 with a rotational symmetry of the stress concentrator bridge 31 and slits 32. Rotational symmetry is unnecessary to exploit the stress concentration principle but to simplify the analysis of the working principle of the stress concentration. We assume a force F acting in the structure at the center of symmetry, acting perpendicular to the plane of the plate 33, and there are $N_{sc}$ stress concentrator bridges 31. In static equilibrium, there are $N_{sc}$ equal and opposite forces in each stress concentrator bridge 31 of the value $F_{sc}=F/N_{sc}$. F is the total stress at the edge of the inner region 21 without the stress concentrator bridge 31.

Figure 15:
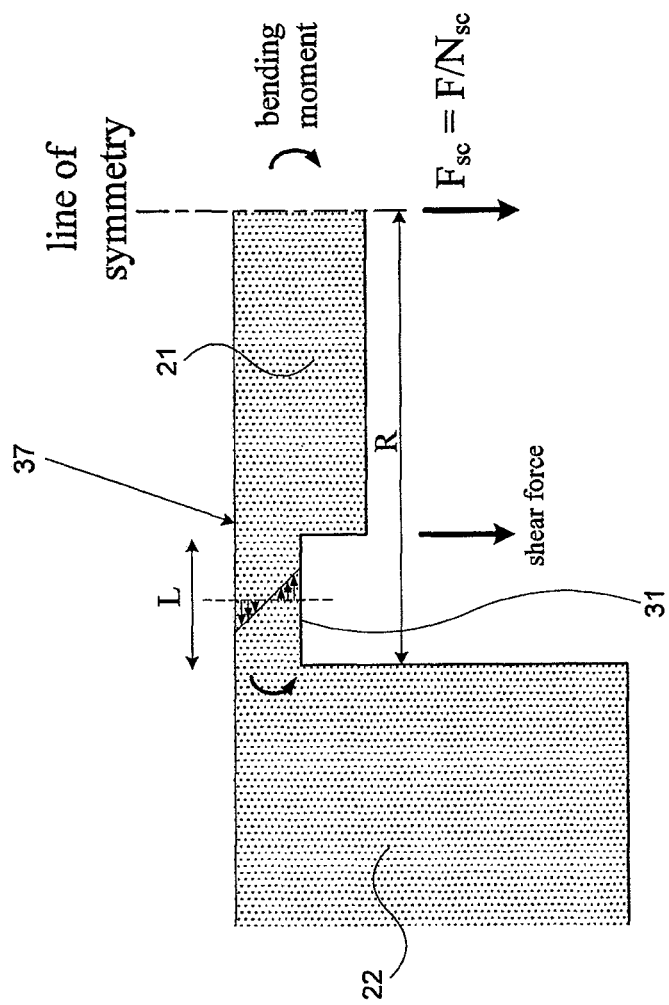
FIG. 15 is a sectional side view of the stress concentrator structure of FIG. 14 from the center of symmetry.

FIG. 15 shows a cross section of the stress concentrator structure from FIG. 14 from the center of symmetry. By symmetry and static equilibrium, the force F is divided into $N_{sc}$ portions and its effect is passed as a shear force $F_{sc}$ as well as a bending moment from the center to the edge 37 of the stress concentrator bridge 31. The value of the bending moment is $M=RF_{sc}=RF/N_{sc}$. If F is the result of a uniform pressure on the inner region 21, then the equivalent effect can be represented as a force $F'=kAp_o$ where k is a constant approximately equal to ⅓, A is the area of the inner region 21 and $P_o$ the pressure. In passing from the center of symmetry to the edge 37 of the stress concentrator bridge 31, the mechanical structure possesses different moments of inertia. This does not effect the bending moment nor the shear force.

Figure 16:
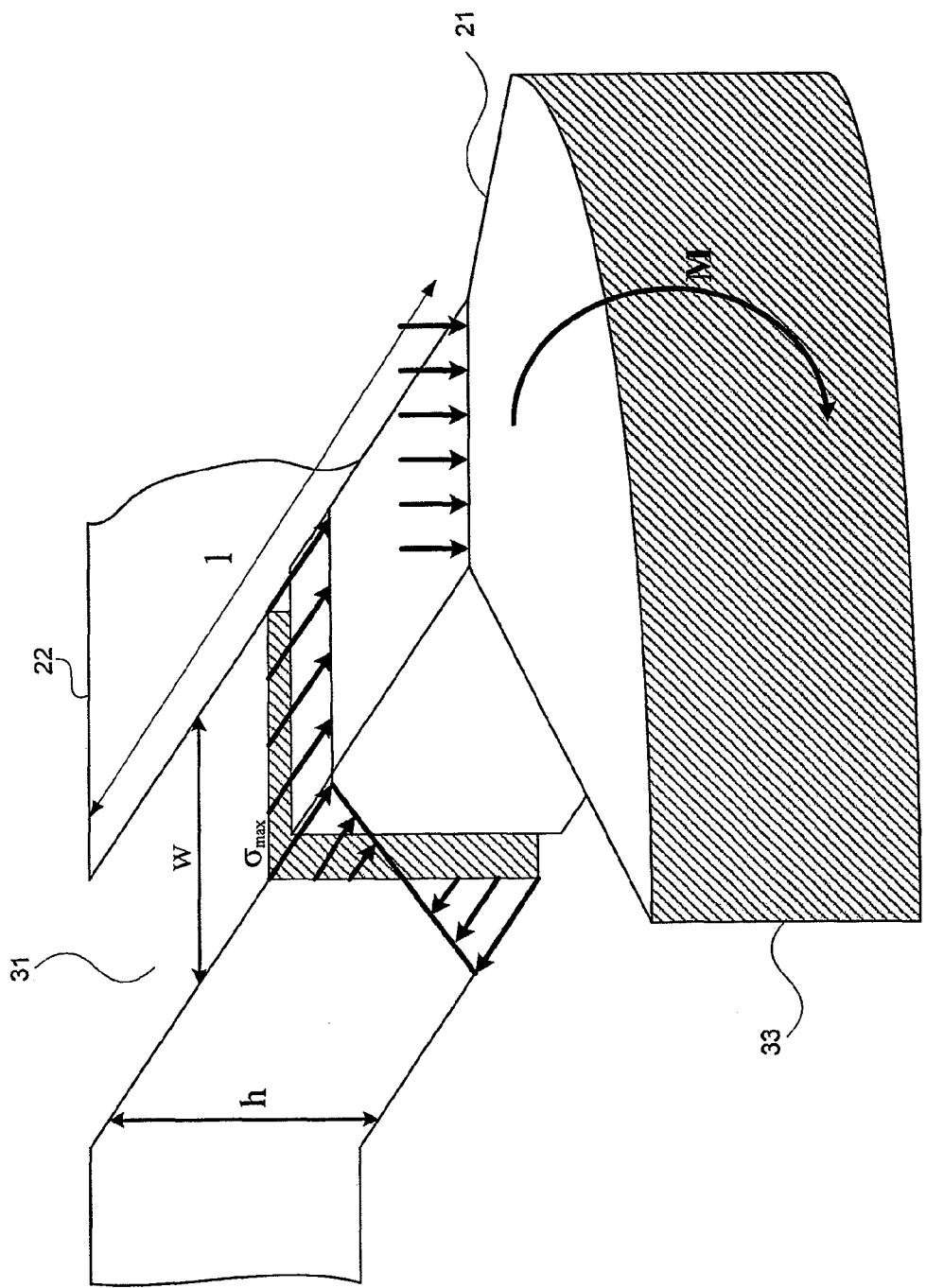
FIG. 16 is a perspective sectional view of the stress concentrator bridge.

FIG. 16 shows the stress distribution near the edge and inside the stress concentrator bridge 31. The inner region 21 is shown in a cut away view and the stress concentrator bridge 31 is shown in its cross sectional view. R is the 'radius' of the stress concentrator structure 20 which represents the distance from the center of symmetry to the outer edge of the stress concentrator bridge 31. The shear force equal to $F_{sc}$ and bending moment M equal to $RF/N_{sc}$ is passed along the sections with different moments of inertia onto the stress concentrator bridge 31 with length equal to l, width equal to w and height equal to h. The shear force is transmitted from the inner region 21. Also, the stress distribution is shown along the length of the stress concentrator bridge 31. The stress distribution is caused by the bending moment. The shear force causes a shear stress along the cross sectional plane and is neglected in this analysis as it does not affect the output of the stress sensor 40 near the surface. The maximum stress at the surface is given by: $\sigma_{max}=Mh/2I$ where I is the moment of inertia of the rectangular stress concentrator bridge 31 equal to $wh^3/12$. The maximum stress caused by the force F is therefore equal to $6RF/(N_{sc} wh^2)$ or rewritten equal to $6(F/N_{sc})(R/w)(1/h^2)$. From this result, we conclude that the maximum stress can be controlled via a parameter approximately equal to R/w which is a number >>1. R/w is the ratio of the dimension of the inner region 21 to the width of the stress concentrator bridge 31. This parameter is referred to as the stress concentration factor or stress amplification factor which represents the amount by which the stress is amplified compared to the case of a plate 33.

Figure 17:
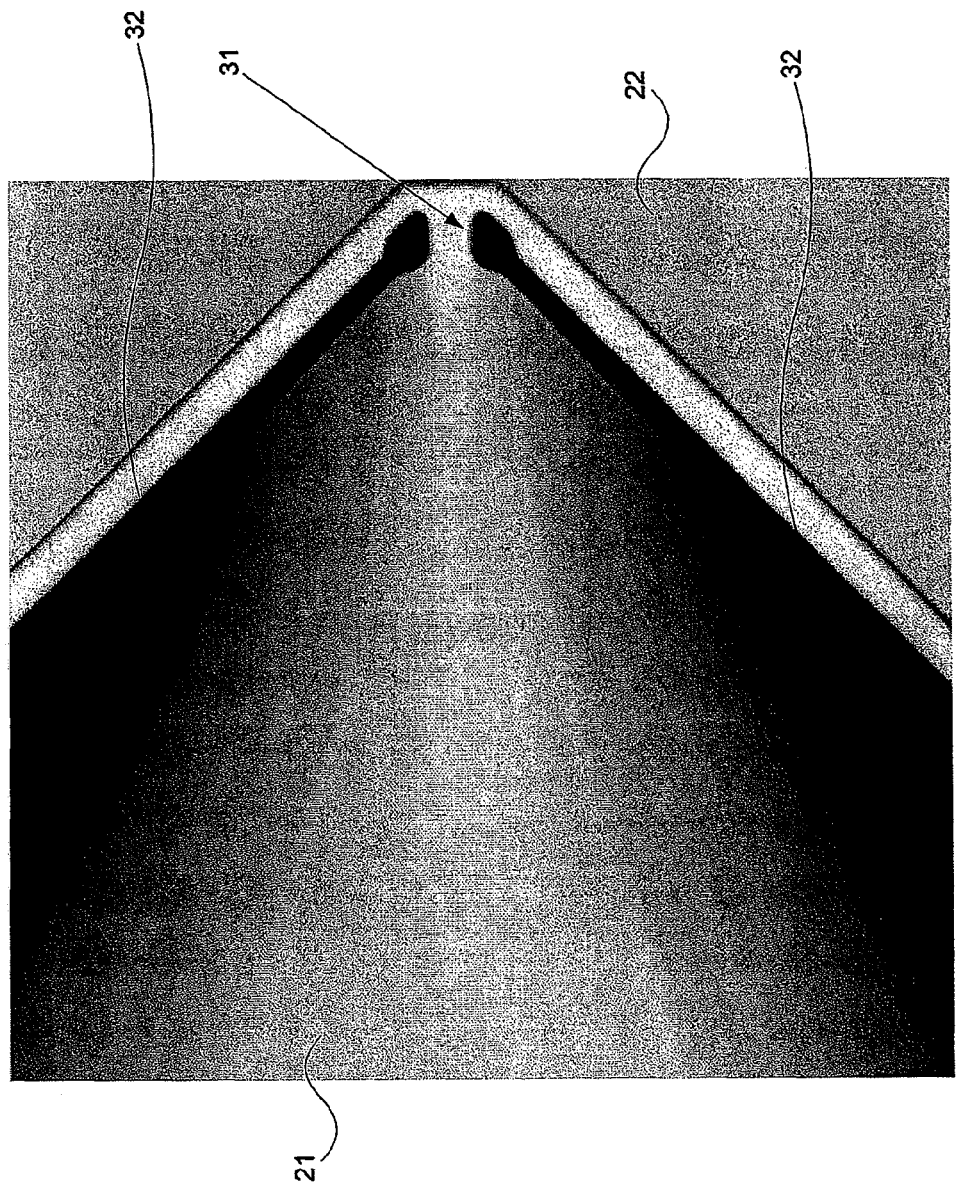
FIG. 17 is a stress distribution diagram of the stress concentrator structure with a force applied at the center of the plat.

FIG. 17 shows the stress distribution in a uniformly thick inner region 21 of the plate 33 subject to uniform pressure. Lighter shading shows region of higher stress. A force applied is at the center of the plate 33.

Figure 18:
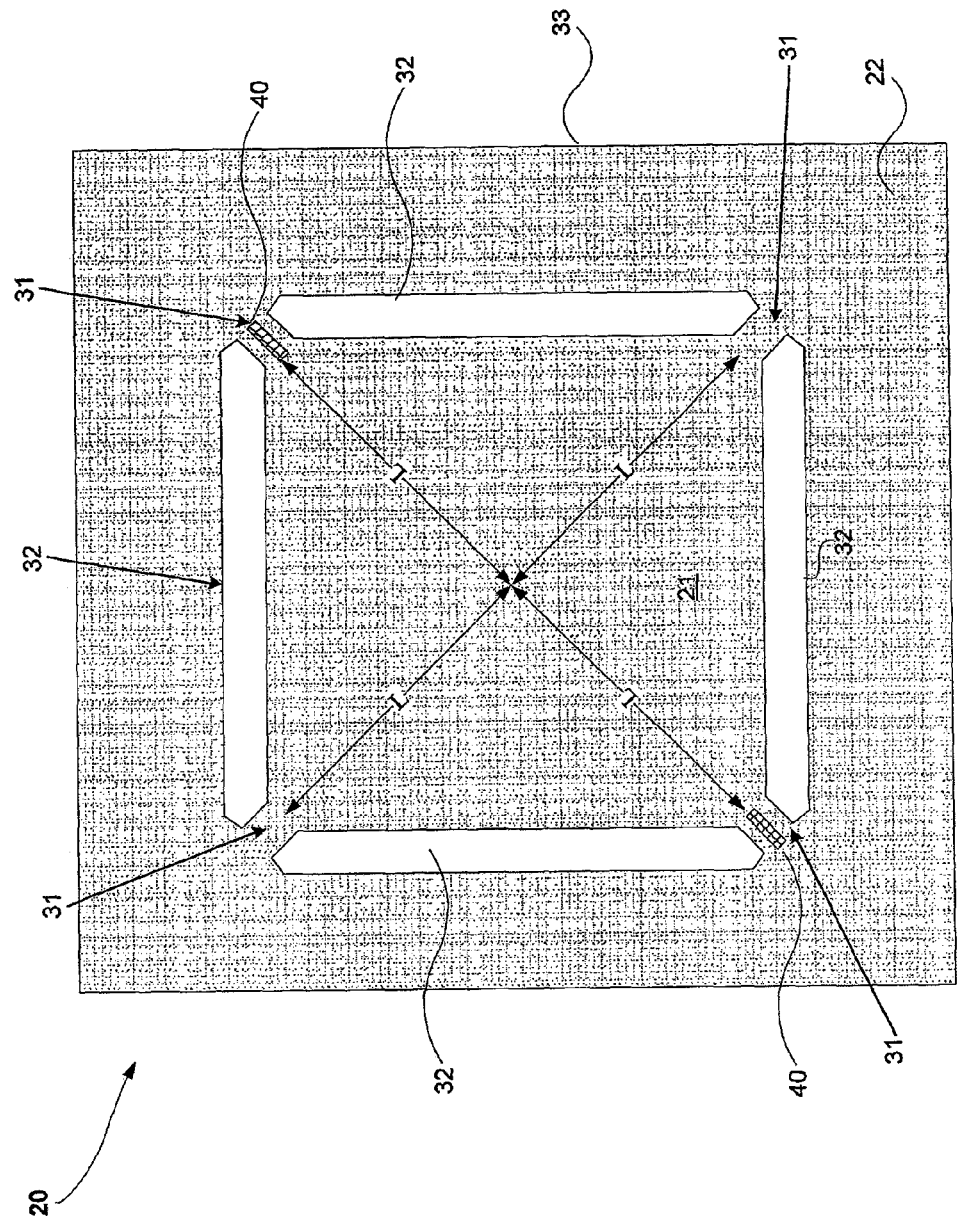
FIG. 18 is a top plan view of an example of a MEMS microphone using the stress concentrator structure.

FIG. 18 is a top plan view of an example of a MEMS microphone using the stress concentrator structure 20. The plate 33 is between 0.5 micron to 1.5 micron thick. The top layer of the plate 33 is usually the material that forms the piezo-electric sensor element 40. When using a silicon implementation, it can be polysilicon or monolithic silicon. The piezo-electric sensor 40 can be a piezo-resistor or a piezo-junction bipolar transistor formed by selective implantation or diffusion into the top layer silicon. The second layer of the plate 33, if it exists, can be a layer of silicon dioxide or silicon nitride. It acts as support and insulation of the first layer from the pedestal, which can be a thick plate of monolithic silicon with a thickness ranging from about 300 to 500 microns. The inner region 21 is square but can equally be rectangular, circular or oval. There are four stress concentrator bridges 31, each at the corner of the square inner region 21 of the plate 33. Two of the stress concentrator bridges 31 are shown to have piezo-electric sensors 40. The actual number is usually determined by the application circuit and requirement of the application. The slits 32 are on four sides of the square inner region 21. The width of the slits 32 ranges between a fraction of a micron to several microns. The slits 32 may be covered by a layer of soft dielectric gel 60 in certain applications where a low frequency response from the microphone is required.

Figure 19:
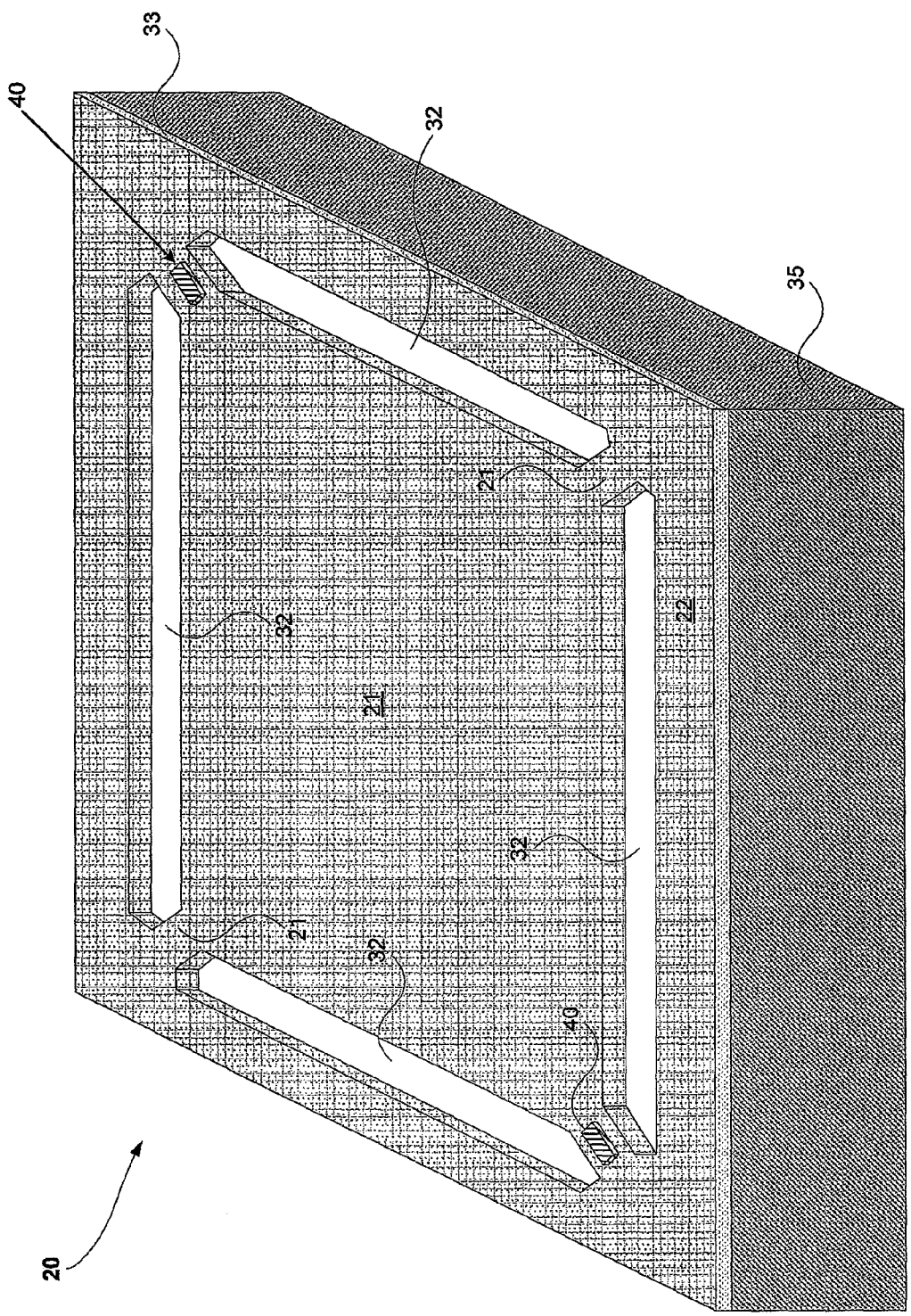
FIG. 19 is a perspective sectional view of the MEMS microphone of FIG. 18.

FIG. 19 shows a perspective sectional view of the MEMS microphone of FIG. 18. The plate 33 and the pedestal 35 are shown.

Figure 20:
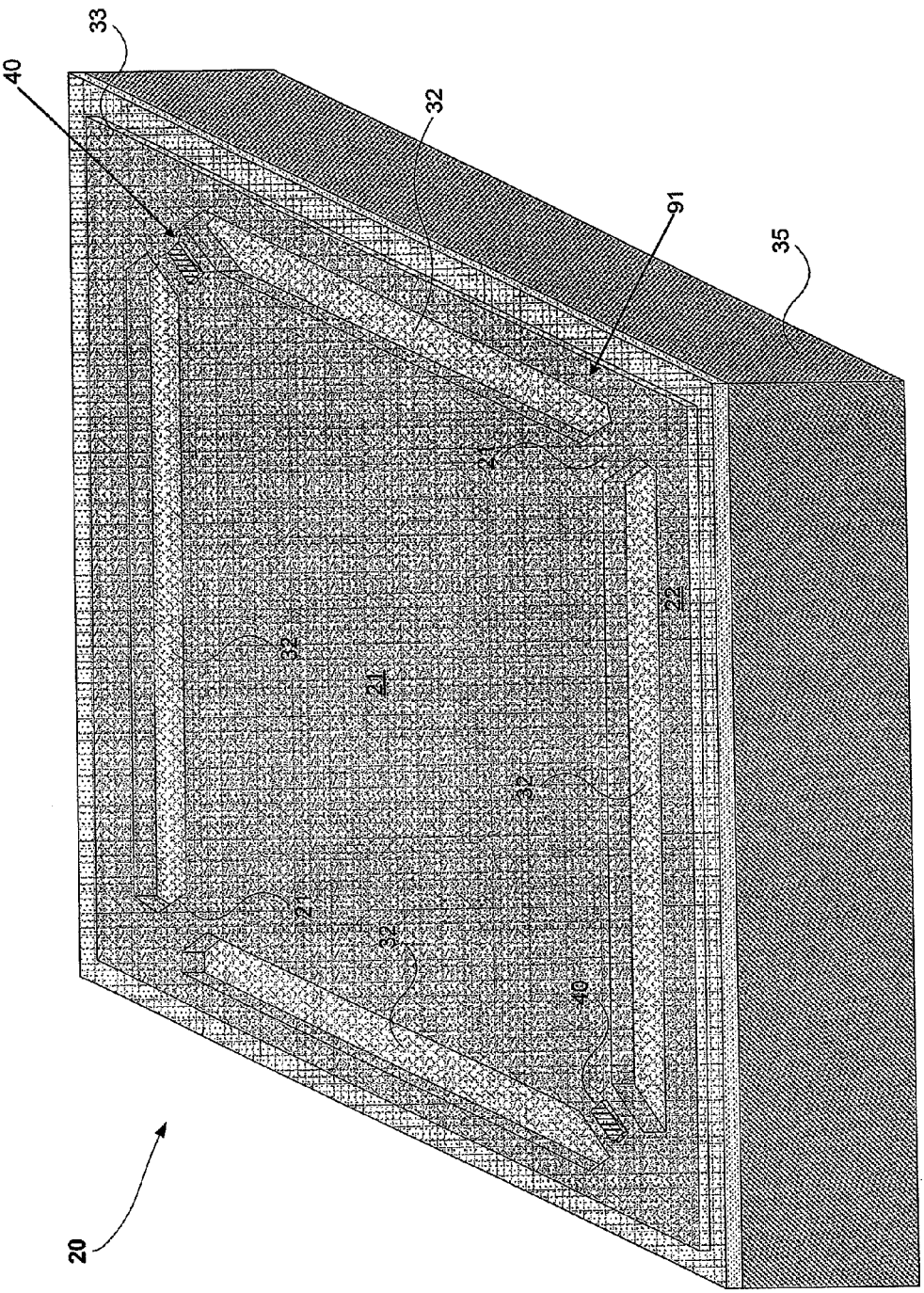
FIG. 20 is a a perspective sectional view of a MEMS pressure sensor based on the MEMS microphone of FIG. 18.

FIG. 20 shows a perspective sectional view of a MEMS pressure sensor based on the MEMS microphone of FIG. 18. A pressure sensor normally detects pressure much higher than that of a microphone (several thousand Pascals versus one to ten Pascals). The plate 33 is usually thicker and the lateral structural dimension of the stress concentrator 31 is smaller than the MEMS microphone. A soft material film 91 with low Young's modulus covers the slits 32.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for manufacturing a stress concentration apparatus for MicroElectroMechanical System (MEMS) sensors, the stress concentration apparatus including a plate having an inner region and outer region, the inner region being separated from the outer region by slits defined in the plate; a stress concentrator bridge configured to connect the inner region to the outer region and configured to mechanically amplify stress applied on the inner region of the plate; and at least one stress sensor operatively connected to the stress concentrator bridge, wherein the at least one stress sensor converts the mechanically amplified stress applied on the inner region into an electrical signal, and wherein the inner region is thinner than the outer region,
the method comprising:
thinning down an inner region of the plate so that the inner region is thinner than an outer region thereof;
etching slits into the silicon plate to separate the inner region from the outer region;
connecting the inner region to the outer region with at least one stress concentrator bridge; and
refilling the slits with a substance or compound to separate upper and lower regions of the plate into two air-tight regions for sensing pressure,
wherein the stress concentration apparatus is for a pressure sensor.

2. A stress concentrating apparatus for MicroElectroMechanical System (MEMS) sensors, the apparatus comprising:

a plate having an inner region and outer region, the inner region being separated from the outer region by slits defined in the plate;

a stress concentrator bridge configured to connect the inner region to the outer region and configured to mechanically amplify stress applied on the inner region of the plate; and at least one stress sensor operatively connected to the stress concentrator bridge, wherein the at least one stress sensor converts the mechanically amplified stress applied on the inner region into an electrical signal, wherein the inner region is thinner than the outer region, wherein the stress concentration bridge has a constriction on at least one of a top surface or a bottom surface thereof.

* * * * *